US008020692B2

(12) United States Patent
Jung et al.

(10) Patent No.: US 8,020,692 B2
(45) Date of Patent: Sep. 20, 2011

(54) APPARATUS FOR TRANSFERRING A TRAY

(75) Inventors: Sung Wha Jung, Suwon (KR); Min Jeong Hwang, Suwon (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 214 days.

(21) Appl. No.: 11/325,465

(22) Filed: Jan. 5, 2006

(65) Prior Publication Data

US 2006/0147298 A1    Jul. 6, 2006

(30) Foreign Application Priority Data

Jan. 5, 2005 (KR) .................. 10-2005-0000950
Jan. 5, 2005 (KR) .................. 10-2005-0000951

(51) Int. Cl.
*B65G 1/133* (2006.01)

(52) U.S. Cl. ............. 198/624; 198/418.4; 198/457.04; 198/786; 414/222.02; 414/749.6

(58) Field of Classification Search ............ 414/222.02, 414/74
See application file for complete search history.

(56) References Cited

U.S. PATENT DOCUMENTS

| | | | |
|---|---|---|---|
| 4,544,319 A * | 10/1985 | Folling et al. ................. | 414/505 |
| 4,765,273 A | 8/1988 | Anderle | |
| 5,735,387 A * | 4/1998 | Polaniec et al. ........... | 198/690.1 |
| 6,006,691 A * | 12/1999 | Wilce ............................ | 114/353 |
| 6,006,891 A * | 12/1999 | Iwano et al. ................. | 198/417 |
| 6,074,617 A * | 6/2000 | DeYoung et al. ............. | 422/104 |
| 6,371,712 B1 * | 4/2002 | White et al. .................. | 414/217 |
| 6,494,308 B2 * | 12/2002 | Bonora et al. ............. | 198/465.2 |
| 6,561,339 B1 * | 5/2003 | Olson et al. .................... | 198/349 |
| 6,941,647 B2 | 9/2005 | Cho et al. | |
| 6,997,670 B2 * | 2/2006 | Kim et al. .................. | 414/749.1 |
| 6,997,970 B2 * | 2/2006 | Crome ................................ | 95/8 |
| 7,168,553 B2 * | 1/2007 | Rice et al. .................. | 198/468.9 |
| 2002/0096417 A1 * | 7/2002 | Veit et al. ................. | 198/370.02 |
| 2004/0016626 A1 * | 1/2004 | Helgerson et al. ............ | 198/788 |
| 2004/0222070 A1 * | 11/2004 | Neiser et al. ............... | 198/781.1 |

FOREIGN PATENT DOCUMENTS

JP    04-125222    4/1992

OTHER PUBLICATIONS

Chinese Office Action dated Jun. 27, 2008.

* cited by examiner

*Primary Examiner* — Kavel Singh
(74) *Attorney, Agent, or Firm* — H.C. Park & Associates, PLC

(57) ABSTRACT

An apparatus for transferring an upright tray at high speeds that can sense an entrance and discharge of the tray. The apparatus includes a transferring unit with pulleys driven by a driving source to form a transferring path. The pulleys contact a fixing member, which is attached to a lower edge of a substrate and mask fixed to the tray. The apparatus also includes a sensing unit with a sensor installed beneath the transferring path to detect the entrance and discharge of the tray. The apparatus may also include rollers disposed to contact both sides of the upper portion of the tray, and the rollers may be coupled with moveable members encased within rails along the transferring path so that the rollers can translate when a tray passes between two rollers. The rollers along both sides of the tray can be arranged symmetrically or alternately in a zigzag pattern.

20 Claims, 8 Drawing Sheets

APPARATUS FOR TRANSFERRING A TRAY

CROSS REFERENCE TO RELATED APPLICATIONS

This application claims priority to and the benefit of Korean Patent Application No. 2005-000950, filed on Jan. 5, 2005, and Korean Patent Application No. 2005-000951, filed on Jan. 5, 2005, which are hereby incorporated by reference for all purposes as if fully set forth herein.

BACKGROUND OF THE INVENTION

1. Field of the Invention

The present invention relates to a tray, and more particularly, to an apparatus for transferring a tray in an upright position that can sense an entrance and discharge of the tray.

2. Discussion of the Background

An electroluminescent display device, which is a type of flat panel display, can be categorized as an inorganic electroluminescent display device or an organic electroluminescent display device, depending upon the source material used to form an emission layer. An organic electroluminescent display device has certain advantages over the inorganic type. Specifically, an organic electroluminescent display device may be driven by low voltage, be lightweight, have a thin profile, a wide viewing angle and a short microsecond response time for displaying an image.

An organic electroluminescent (EL) device of an organic electroluminescent display device can consist of an anode, an organic material layer, and a cathode formed in layers on a substrate. The organic material layer includes an organic emitting layer, which emits light by combining holes with electrons. To efficiently transport holes and electrons to the organic emission layer to emit light, an electron injecting layer and an electron transport layer can be formed between the cathode and the organic emitting layer, and a hole injecting layer and a hole transport layer can be formed between the anode and the organic emitting layer. These additional layers can improve the emission efficiency of the organic EL device.

An organic electroluminescence device with the structure as described above can be produced by a physical vapor deposition method such as a vacuum deposition method, an ion plating method and sputtering or a chemical vapor deposition method using gas reaction. Of these methods, the vacuum deposition method is widely used. In the vacuum deposition method, carried out in a vacuum chamber, organic material is vaporized in a deposition source, and organic material vapor is ejected from the deposition source and deposited on the substrate.

As displays have become larger, the size of the substrate has also become larger. Thus, a deposition system has been developed in which a deposition source moves up and down inside a vacuum chamber and ejects organic material vapor to form an organic material layer on the larger substrate.

In this type of deposition system, the deposition source can be driven by a driving shaft rotating axially to move the deposition source up and down. While the deposition source moves up and down, the deposition source ejects organic material vapor formed by evaporating organic material.

As the substrate has become larger, a vertical alignment system for aligning the substrate and the mask while positioned upright state has been developed. A vertical alignment system would prevent a larger substrate from bending during the deposition process, thus providing a deposition of higher quality.

To position the substrate vertically, a substrate tray holder can be installed and reciprocated. A fixing member, which is attached to the substrate, protrudes from the substrate tray holder. Additionally, a holder plate can be disposed vertically.

Also, to control and improve such conditions as a transferring speed and location of the substrate, to the transferring apparatus can sense an entrance and discharge of the substrate. Additionally, a transferring apparatus for transferring the upright tray, to which the glass substrate and the mask are attached, and a guide means for holding the tray vertically can be included.

SUMMARY OF THE INVENTION

This invention provides an apparatus for transferring a tray while in the upright position and detecting entrance and discharge of the tray.

Additional features of the invention will be set forth in the description which follows, and in part will be apparent from the description, or may be learned by practice of the invention.

The present invention discloses an apparatus for transferring a tray, including a transferring unit including a plurality of pulleys to form a transferring path, a driving source coupled with a first pulley, and a sensing unit with a sensor installed on the transferring path of the tray to sense an entrance and discharge of the tray. Further, the first pulley or a second pulley contacts a lower surface of the tray, to which a substrate and a mask are fastened.

The present invention also discloses apparatus for transferring a tray, including a first guide unit contacting an upright tray, a driving unit to drive the first guide unit, and a second guide unit to guide the first guide unit.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
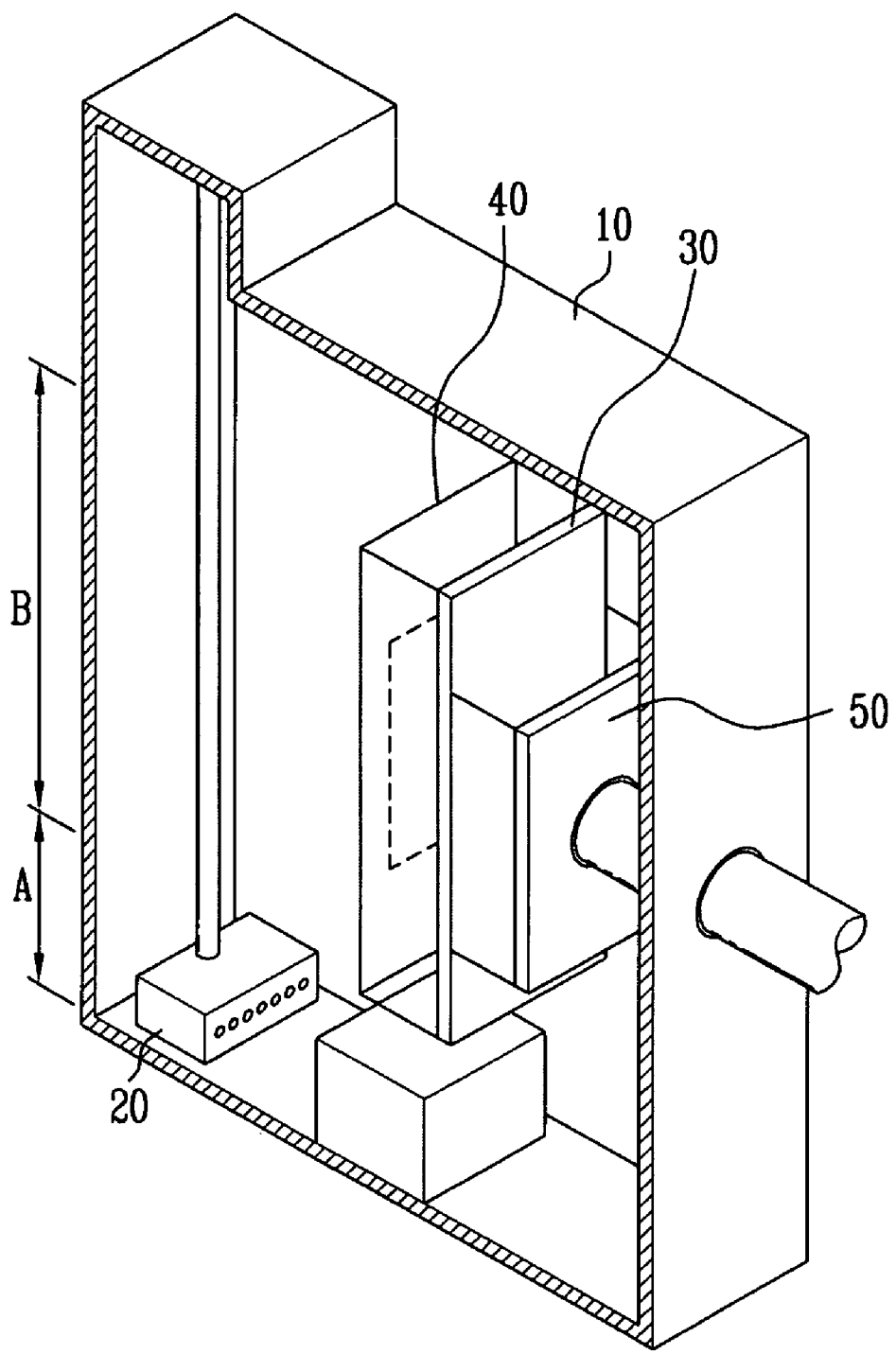
FIG. 1 shows a schematic view of a deposition source located in a buffer area of a vacuum deposition system in which an apparatus for transferring a tray according to an embodiment of the present invention is installed.

The invention is described more fully hereinafter with reference to the to accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like numerals refer to the same or similar components.

Figure 2:
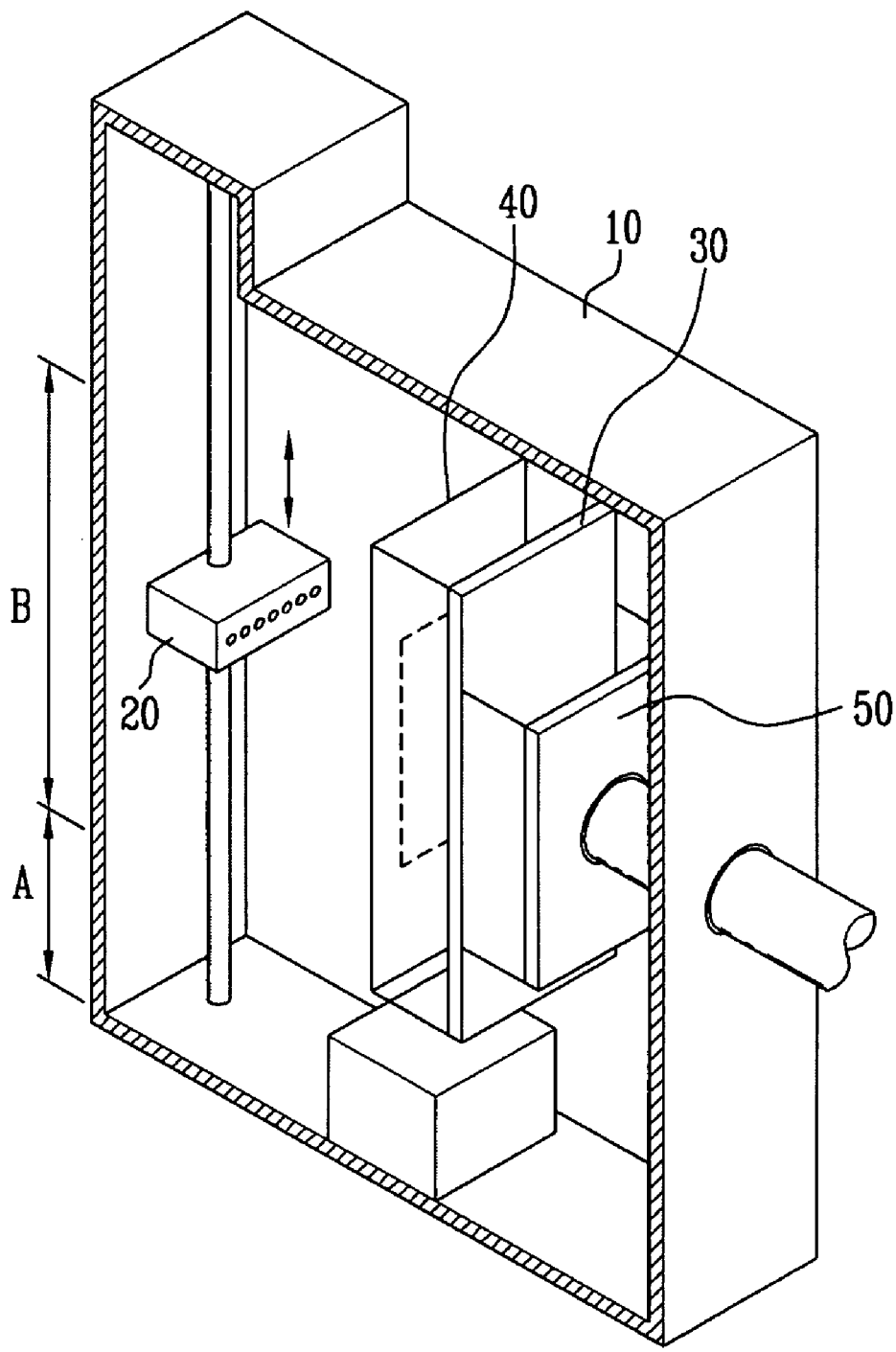
FIG. 2 shows a schematic view of the deposition source located in a layer-forming area of the vacuum deposition system in which the apparatus for transferring a tray according to an embodiment of the present invention is installed.

FIG. 1 shows a schematic view of a deposition source located in a buffer area of a vacuum deposition system in which an apparatus for transferring a tray according to an embodiment of the present invention is installed. FIG. 2 shows a schematic view of the deposition source located in a layer-forming area of the vacuum deposition system in which the apparatus for transferring a tray according to an embodiment of the present invention is installed.

Referring to FIG. 1, a substrate 30, on which an organic material layer is formed, a mask 40 placed in front of the substrate 30, and a deposition source 20 spaced apart from the mask 40 are arranged in a vacuum chamber 10 of a vacuum deposition system 100. The mask 40 and the substrate 30 are aligned by an alignment system (not shown) and fixed to a chuck 50 so that the mask 40 and the substrate 30 are separated by a small distance.

The mask 40 is divided into a pattern-forming section (indicated by a dashed line) and a fixing section to be fastened to a mask frame (not shown) by, for example, a welding process. The pattern-forming section corresponds to a portion of the substrate 30 where organic material layers are to be formed. Similarly, the vacuum chamber 10 is divided into a layer-forming area B, which corresponds to a region in which the mask 40 and the substrate 30 are installed, and a buffer area A which corresponds to the entire vacuum chamber except for layer-forming area B.

The deposition source 20 can be mounted to a driving shaft which is rotated by a moving means (not shown). The deposition source 20 can be moved up into the layer-forming area B (as shown in FIG. 2) and down according to a rotational direction of the driving shaft.

Figure 3:
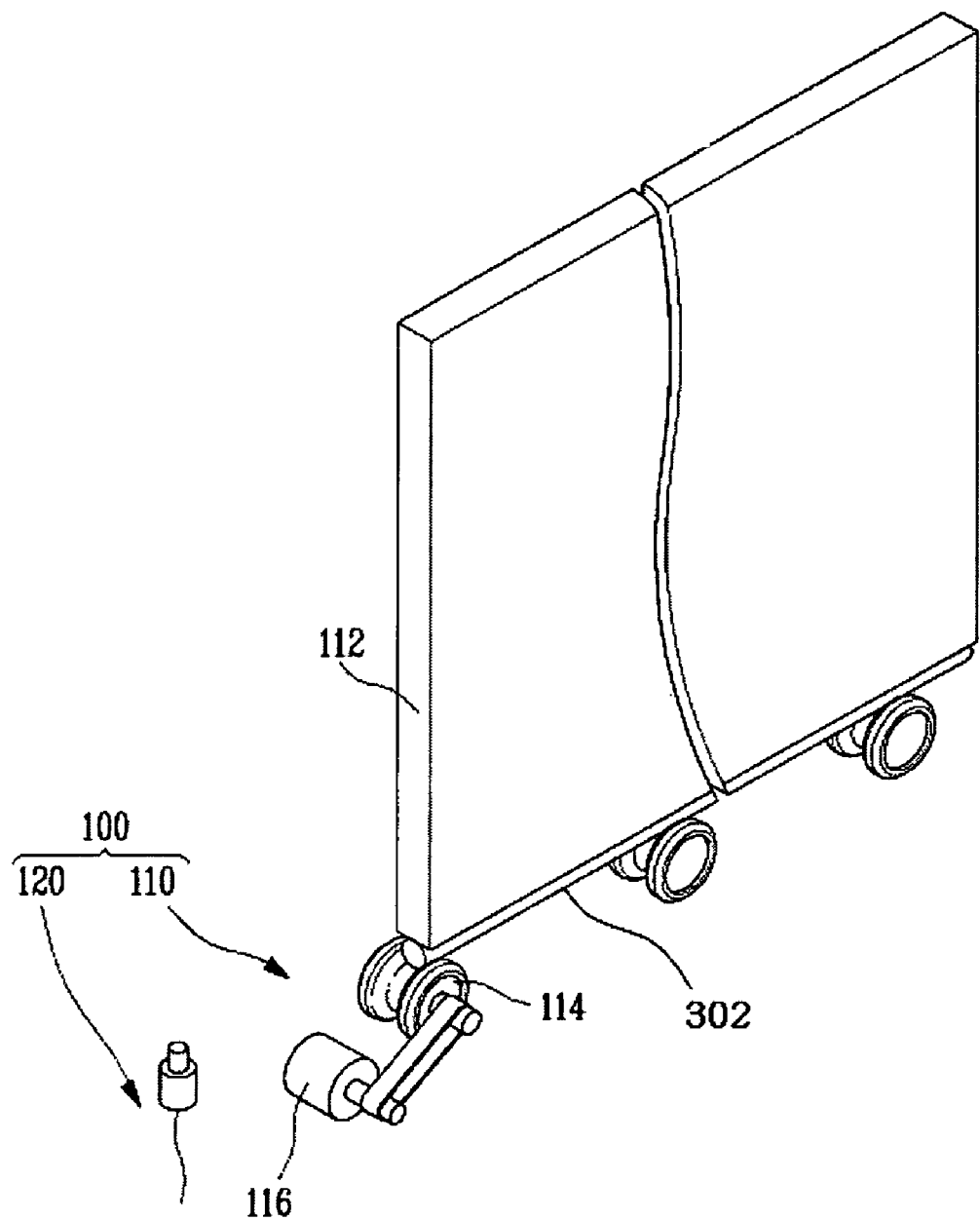
FIG. 3 shows a schematic perspective view of an apparatus for transferring a tray according to a first embodiment of the present invention.
Figure 4:
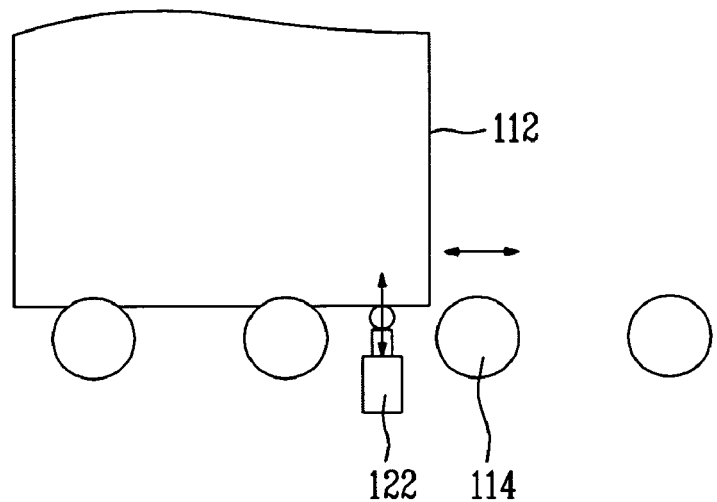
FIG. 4 shows a schematic partial side view of one embodiment of a sensing unit of the apparatus for transferring a tray shown in FIG. 1.
Figure 5:
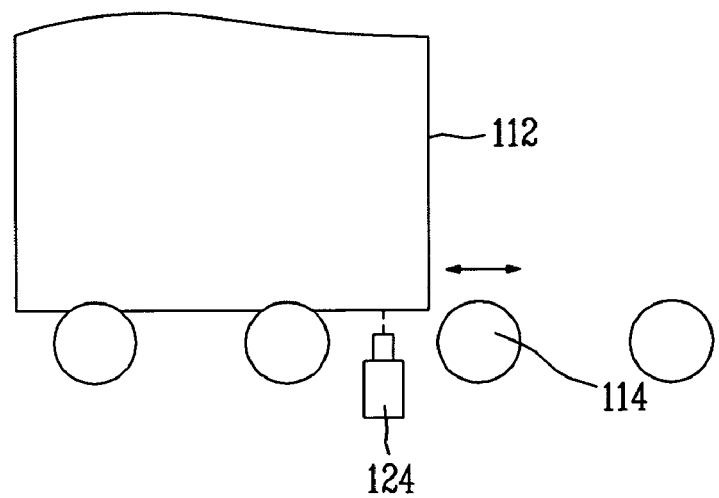
FIG. 5 shows a schematic side view of another embodiment of the sensing unit shown in FIG. 1.
Figure 6:
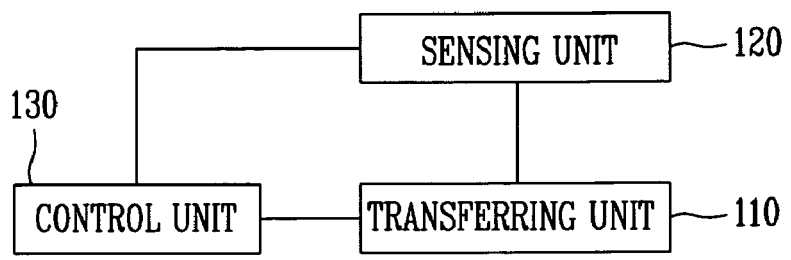
FIG. 6 shows a block diagram illustrating a connection among the sensing unit shown in FIG. 4 or FIG. 5 and peripheral devices.

FIG. 3 shows a schematic perspective view of an apparatus for transferring a tray according to a first embodiment of the present invention. FIG. 4 shows a schematic partial side view of one embodiment of a sensing unit of the apparatus for transferring a tray shown in FIG. 1. FIG. 5 shows a schematic side view of another embodiment of a sensing unit shown in FIG. 1. FIG. 6 shows a block diagram illustrating a connection among the sensing unit shown in FIG. 4 or FIG. 5 and peripheral devices.

As shown in FIG. 3, an apparatus 100 for transferring a tray includes a transferring unit 110 consisting of a plurality of pulleys 114 disposed to contact with a lower surface of a tray 112 for transferring the tray 112. The apparatus 100 also includes a sensing unit 120 consisting of a sensing sensor positioned along a transferring path of the tray 112 for sensing an entrance and discharge of the tray 112. Although not shown in FIG. 3, the substrate and the mask are fastened to the tray 112.

The tray 112 is placed on a rod-shaped fixing member 302 and a plurality of pulleys 114 are located below the tray 112 to enable the tray 112 to be transferred by rotation of the pulleys 114. The pulleys 114 can be rotated by a motor 116 to transfer the tray 112.

As shown in FIG. 4 and FIG. 5, the sensing sensor may be a contact sensor 122, as shown in FIG. 4, or a non-contact sensor 124 as shown in FIG. 5.

Where the contact sensor 122 is used as the sensing sensor, the contact sensor 122 can be interposed between the pulleys 114, which contact a lower surface of the tray 112 and may contact the tray.

The contact sensor 122 can be disposed such that a lower surface of the tray 112 contacts with a head section of the sensor 122. The sensor 122 can be disposed such that an upper surface of the head section can correspond with a lower surface of the tray 112 or can be positioned slightly above a lower surface of the tray 112. Where the head section is positioned slightly above a lower surface of the tray 112, the head section can elastically deflect or can move vertically when the tray 112 contacts the head section. Then, when the tray 112 passes the head section, the head section can return to its original position.

Where the non-contact sensor 124 is used as the sensing sensor, the non-contact sensor 124 should be positioned below the tray 112 and can sense an entrance and discharge of a lower surface of the tray 112.

Alternatively, a non-contact sensor 124 may be positioned to sense a side surface or an upper surface of the tray 112.

An additional mounting member can be provided to protect the non-contact sensor 124 from an external shock or exterior environment, and the non-contact sensor 124 can be positioned in a fixed location by the mounting member where the location corresponds to a side surface, lower surface or an upper surface of the tray 112 being transferred.

Various elements that generate, for example, ultrasonic waves, radio waves, light, infrared rays, ultraviolet rays, magnetism or a combination thereof can be used to manufacture the non-contact sensor 124, and various sensors, including, for example, an ultrasonic wave sensor, a light sensor, an optical fiber sensor, an infrared ray sensor, a magnetic sensor or an ultraviolet ray sensor using one of the above listed elements can be used as the non-contact sensor.

As shown in FIG. 6, a control unit 130 for receiving data transmitted from the sensing unit 120, for reading a location and moving speed of the tray 112, and for controlling a processing speed is provided. The control unit 130 recognizes a location and moving speed of the tray 112 and can control the transferring unit 110 transferring the tray 112 accordingly.

An operation of the apparatus for transferring a tray according to a second embodiment is described briefly below.

Figure 7:
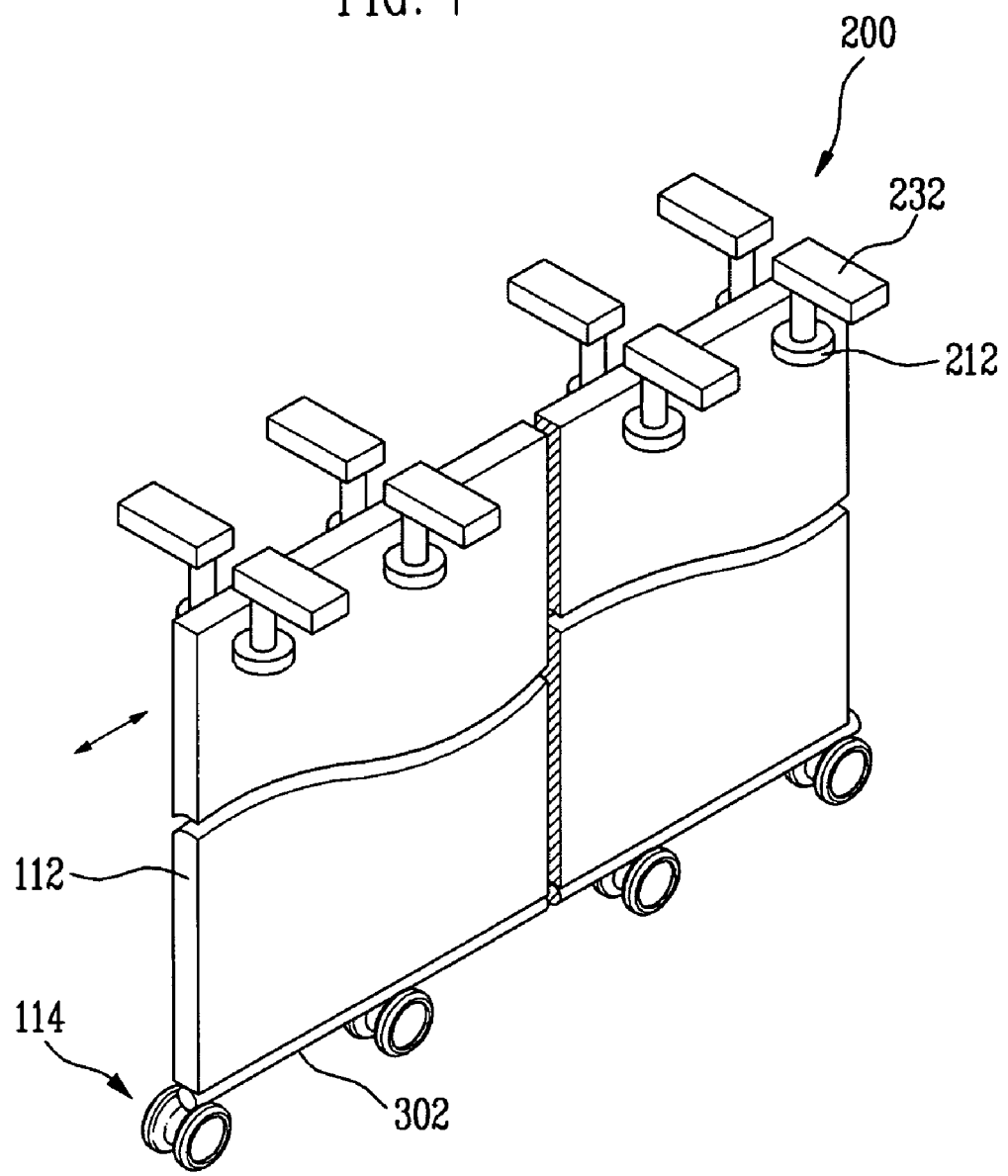
FIG. 7 shows a schematic perspective view of an apparatus for transferring a tray according to a second embodiment of the present invention.
Figure 8:
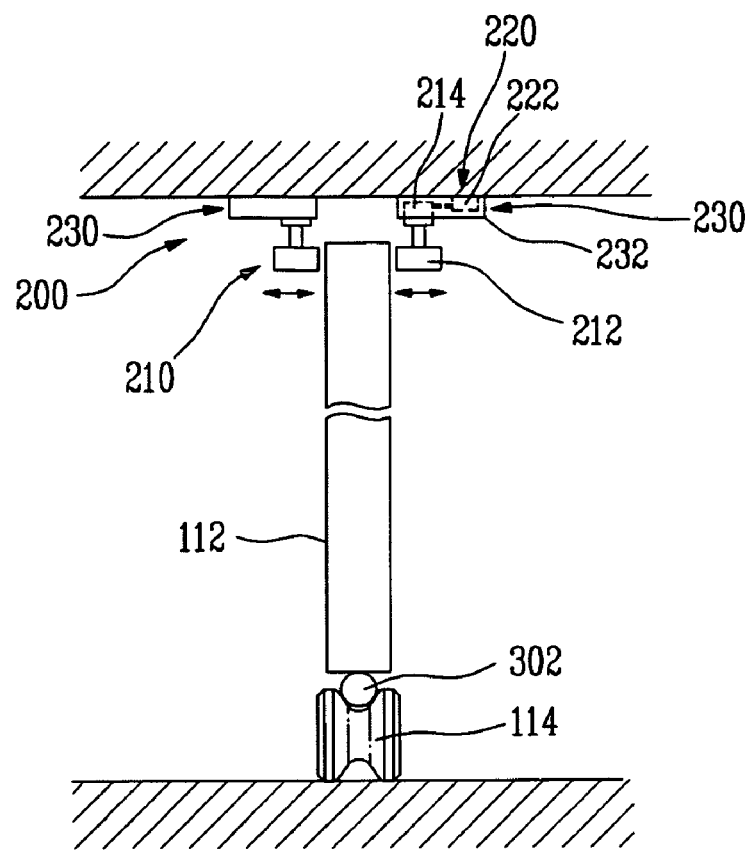
FIG. 8 shows a section view of the transferring apparatus shown in FIG. 7.
Figure 9:
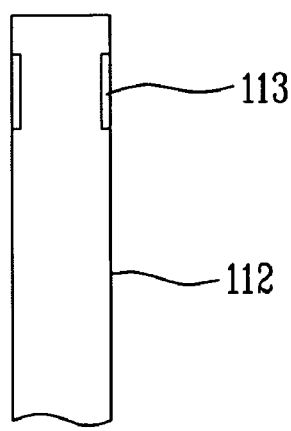
FIG. 9 shows a partial enlarged view of an upper region of the tray according to an embodiment of the present invention.

FIG. 7 shows a schematic perspective view of an apparatus for transferring a tray according to the second embodiment of the present invention. FIG. 8 shows a section view of the transferring apparatus shown in FIG. 7. FIG. 9 shows a partial enlarged view of an upper region of the tray according to an embodiment of the present invention.

As shown in FIG. 7 and FIG. 8, an apparatus 200 for transferring a tray according to the second embodiment of the present invention includes a first guide unit 210 contacting the upright tray 112 and maintaining the tray's upright position;

a driving unit 220 for reciprocating the guide unit 210; and a second guide unit 230 for guiding upright tray 112 moved by the driving unit 220 along a path.

The tray 112 can be transferred by an additional driving means including a plurality of pulleys 114 rotated by a motor (shown as motor 116 on FIG. 3). Each pulley can have a circular groove formed on an outer circumference surface thereof, and a rod-shaped fixing member 302 can be attached to a lower surface of the tray 112 and placed in the circular groove of a pulley 114.

Additionally, the first guide unit 210 can include a plurality of rollers 212 and a moving member 214, on which a roller 212 is mounted. The moving member can be driven by the driving unit 220 and can reciprocate.

The rollers 212 can be disposed on both sides of the tray 112 and can contact the side surfaces of the tray 112. The rollers can be disposed symmetrically on both sides of the tray 112 or can alternate in a zigzag shape. The zigzag shape is shown in detail in FIG. 11.

The rollers 212 can translate in an outward direction from the tray 112 to contact the tray 112 when the tray 112 enters between the rollers 212, and the rollers 212 can translate back to their original locations when the tray 112 exits from between the rollers 212.

The moving member 214 can be installed and coupled to a driving source 222 of the driving unit 220. The moving member can be provided on a rail 232 of the second guide unit 230, and a movement of the moving member 214 can be guided by the rail.

The driving unit 220 includes the moving member 214 and the driving source 222. The driving source 222 can include a cylinder or motor and can supply a reciprocation force to the moving member 214.

Where a motor is used as the driving source 222, a driving force of the motor can be transmitted to the moving member 214 through a connection member such as a belt or chain, and where a cylinder is used as the driving source 222, the moving member 214 can be directly fixed to an operating rod of the cylinder.

The second guide unit 230 can be used to provide a moving path along which the moving member 214 moves stably and smoothly by the driving source 222. The second guide unit 230 can include a rail 232.

The driving source 222 can also be included within the guide unit 230.

As shown in FIG. 9, reinforcing members 113 can be attached to portions of one or both side surfaces of the tray 112 against which the rollers 212 contact. Therefore, friction and abrasion due to contact between the tray 112 and the rollers 212 can be avoided.

Figure 10:
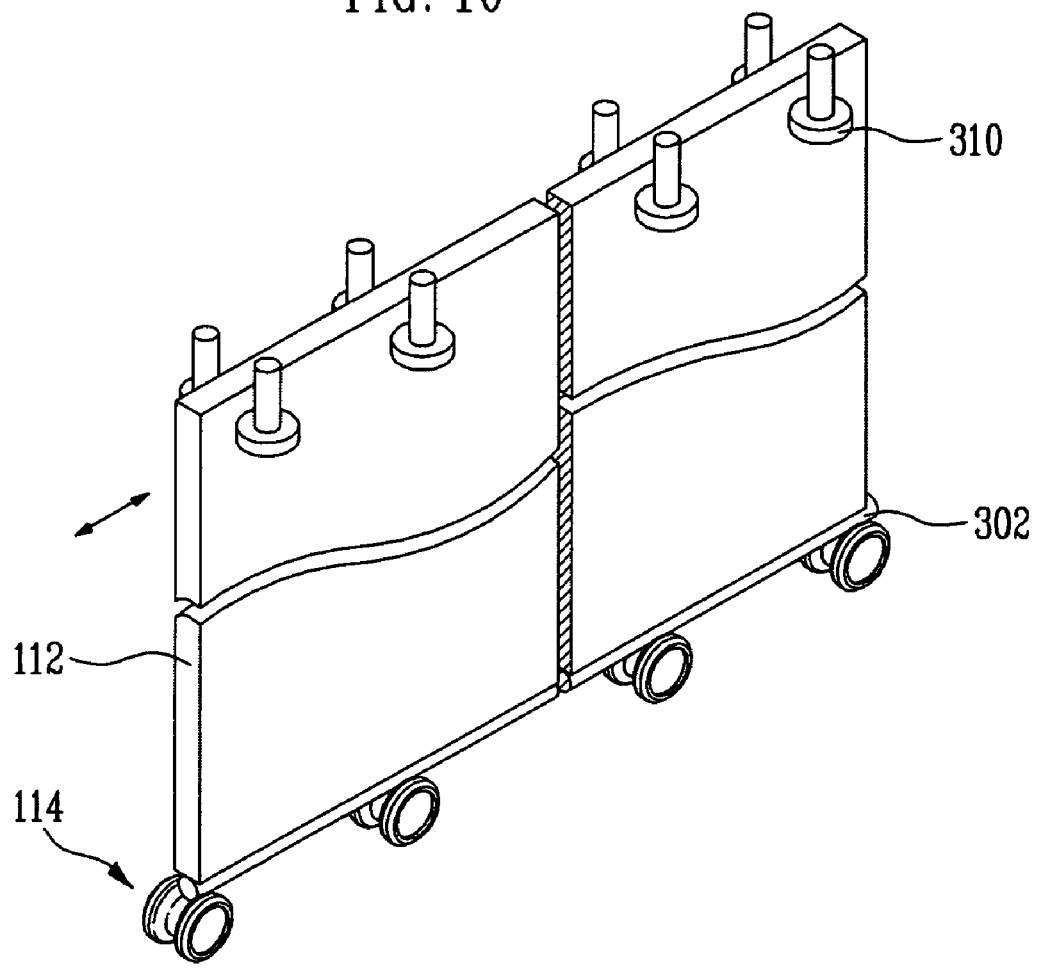
FIG. 10 shows a schematic perspective view of an apparatus for transferring a tray according to the third embodiment of the present invention.
Figure 11:
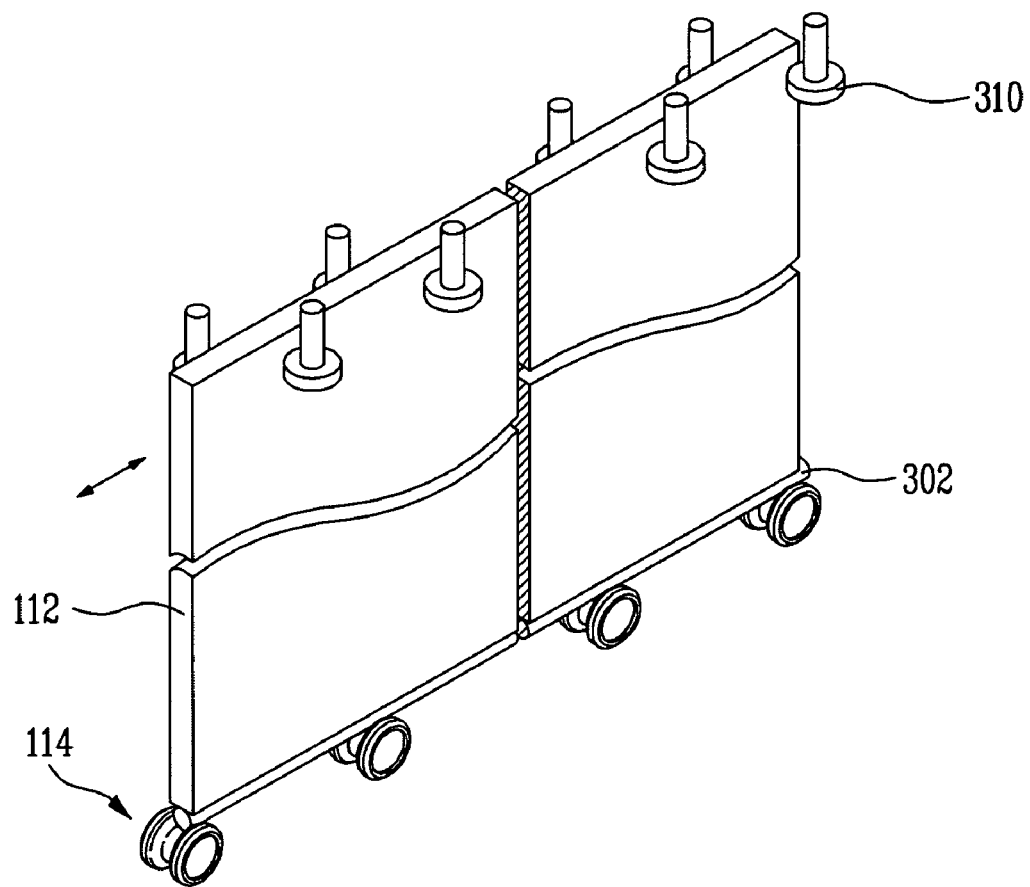
FIG. 11 shows a perspective view of a zigzag arrangement of rollers.

FIG. 10 shows a schematic perspective view of an apparatus for transferring a tray according to the third embodiment of the present invention. FIG. 11 shows a perspective view of to a zigzag arrangement state of rollers.

As shown in both FIG. 10 and FIG. 11, in the apparatus for transferring a tray, a plurality of the rollers 310 are disposed at both sides of the upright tray, and the rollers contact intermittently with both side surfaces of the tray 112 when the upright tray 112 is transferring between the rollers.

The space between two rollers 310 positioned opposite from each other can be selected so that the rollers 310 permit the tray 212 to transfer between the rollers, and so that the roller 310 do not hinder transfer of the tray 212. Also, a maximum space between two oppositely positioned rollers 310 can be selected so that the tray 212 transferring between the two facing rollers 310 is not substantially inclined and the fixing member 302 maintains its position on a pulley 114.

The rollers 212 can be disposed symmetrically at both sides of the tray 112, as shown in FIG. 10, or can be disposed to alternate on both sides of the tray 112 in a zigzag shape, as shown in FIG. 11.

Operation of the apparatus for transferring a tray according to the third embodiment is described briefly below.

The upright tray 112, prior to entering between the rollers 212, is driven by the separate driving means coupled with the pulleys 114 provided below the tray 112. Once the upright tray 112 enters between two rollers 212, the upright state of the tray 112 is maintained by the plurality of rollers 212 contacting both side surfaces of an upper portion of the tray 112.

Also, reinforcing members 113 attached to portions of both side surfaces of the tray 112 as shown in FIG. 9 can prevent abrasion to portions of the tray 112 caused by contact between the tray 112 and each roller 212.

While between the rollers 212, the tray 112 is supported by the rollers 212 so rolling of the tray 112 can be avoided, and the tray 112 can be transferred at increased speeds.

The present invention constructed as above can avoid damage to the sensing unit 120 and may lengthen the expected life span of the sensor. This can reduce expenses for replacing the sensing unit 120 with a new sensing unit. Also, transfer speed of the tray 112 may increase to reduce time required for transferring the tray, and a processing speed of the entire process may be reduced to increase productivity.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An apparatus for transferring a tray, comprising,
 a tray comprising a rod-shaped fixing member coupled with a lower surface of the tray;
 a transferring unit comprising a plurality of pulleys to form a transferring path of the tray;
 a driving source coupled with a first pulley; and
 a sensing unit comprising a sensor installed on the transferring path of the tray to sense an entrance and discharge of the tray,
 wherein when the tray is being transferred, at least one pulley among the plurality of pulleys contacts the rod-shaped fixing member, and the rod-shaped fixing member is disposed directly between the at least one pulley and the tray.

2. The apparatus of claim 1, wherein the sensor is a non-contact sensor comprising an ultrasonic wave sensor, a light sensor, an optical fiber sensor, a magnetic sensor, an infrared ray sensor or an ultraviolet ray sensor.

3. The apparatus of claim 2, wherein the non-contact sensor is positioned below the tray to sense the lower surface of the tray.

4. The apparatus of claim 1, wherein the sensor is positioned below the tray to sense the lower surface of the tray.

5. The apparatus of claim 1, wherein driving source drives the first pulley to rotate.

6. The apparatus of claim 1, further comprising:
 a control unit to receive signals from the sensing unit regarding an entrance or discharge time of the tray and to control the transferring unit or the driving unit on the basis of the signals.

7. The apparatus of claim 2, further comprising:
a control unit to receive signals from the sensing unit regarding an entrance or discharge time of the tray and to control the transferring unit or the driving unit on the basis of the signals.

8. An apparatus for transferring a tray, comprising:
a tray;
a first guide unit configured to contact the tray and maintain the tray in an upright position;
a driving unit to drive the first guide unit; and
a second guide unit to guide the first guide unit,
wherein the first guide unit comprises a plurality of first rollers disposed at a first side surface of the upright tray and a plurality of second rollers disposed at a second side surface of the upright tray,
wherein at least one first roller contacts the first side surface of the upright tray and at least one second roller contacts the second side surface of the upright tray, and
wherein the first side surface and the second side surface face opposite directions.

9. The apparatus of claim 8, wherein the driving unit comprises a driving source coupled with the second guide unit.

10. The apparatus of claim 8, wherein the first guide unit further comprises a moving member, and the second guide unit comprises a rail to guide a movement of the moving member.

11. The apparatus of claim 8, wherein the first guide unit further comprises:
a moving member mounted to the second guide unit,
wherein one of the plurality of first rollers is coupled with the moving member and the driving unit is coupled with the moving member to enable the moving member to translate.

12. The apparatus of claim 11, wherein the driving unit comprises a driving source coupled with the moving member.

13. The apparatus of claim 11, wherein the second guide unit comprises a rail encasing the moving member to form a transferring path along which the moving member is guided.

14. An apparatus for transferring a tray, comprising:
a tray;
a first guide unit configured to contact the tray and maintain the tray in an upright position;
a driving unit to drive the first guide unit; and
a second guide unit to guide the first guide unit,
wherein the first guide unit comprises a plurality of first rollers disposed at a first side surface of the upright tray and a plurality of second rollers disposed at a second side surface of the upright tray,
wherein at least one first roller contacts the first side surface of the upright tray and at least one second roller contacts the second side surface of the upright tray,
wherein the first guide unit further comprises:
a moving member mounted to the second guide unit,
wherein one of the plurality of first rollers is coupled with the moving member and the driving unit is coupled with the moving member to enable the moving member to translate, and
wherein the plurality of first rollers are disposed on the first side surface of the upright tray and the plurality of second rollers are disposed on the second side surface of the upright tray symmetrically with the plurality of first rollers.

15. An apparatus for transferring a tray, comprising:
a tray;
a first guide unit configured to contact the tray and maintain the tray in an upright position;
a driving unit to drive the first guide unit; and
a second guide unit to guide the first guide unit,
wherein the first guide unit comprises a plurality of first rollers disposed at a first side surface of the upright tray and a plurality of second rollers disposed at a second side surface of the upright tray,
wherein at least one first roller contacts the first side surface of the upright tray and at least one second roller contacts the second side surface of the upright tray,
wherein the first guide unit further comprises:
a moving member mounted to the second guide unit,
wherein one of the plurality of first rollers is coupled with the moving member and the driving unit is coupled with the moving member to enable the moving member to translate, and
wherein the plurality of first rollers are disposed on the first side surface of the upright tray, the plurality of second roller are disposed on the second side surface of the upright tray to alternate with the plurality of first rollers in a zigzag shape.

16. The apparatus of claim 11, further comprising:
a sensing unit with a sensor installed on the transferring path of the tray to sense an entrance and discharge of the tray.

17. The apparatus of claim 16, wherein the sensor is a non-contacting sensor comprising an ultrasonic wave sensor, a light sensor, an optical fiber sensor, a magnetic sensor, an infrared ray sensor, or an ultraviolet ray sensor.

18. The apparatus of claim 17, wherein the non-contact sensor is positioned below the tray to sense a lower surface of the tray.

19. The apparatus of claim 11, wherein the plurality of first rollers contact a reinforcing member fixed to the first side surface of the tray.

20. The apparatus of claim 1, wherein at least one pulley has a circular groove,
wherein the rod-shaped fixing member is disposed in the circular groove.

* * * * *